United States Patent [19]
Chen

[11] Patent Number: 4,862,463
[45] Date of Patent: Aug. 29, 1989

[54] ERROR CORRECTING CODE FOR 8-BIT-PER-CHIP MEMORY WITH REDUCED REDUNDANCY

[75] Inventor: Chin-Long Chen, Wappingers Falls, N.Y.

[73] Assignee: International Business Machines Corp., Armonk, N.Y.

[21] Appl. No.: 258,080

[22] Filed: Oct. 17, 1988

Related U.S. Application Data

[63] Continuation of Ser. No. 75,390, Jul. 20, 1987, abandoned.

[51] Int. Cl.$^4$ ............................................. G06F 11/10
[52] U.S. Cl. ..................................... 371/38; 371/37
[58] Field of Search ................... 371/37, 38, 39, 40

[56] References Cited

U.S. PATENT DOCUMENTS

| | | | |
|---|---|---|---|
| 3,623,155 | 11/1971 | Hsiao et al. | 371/37 |
| 3,629,824 | 12/1971 | Bossen | 371/38 |
| 3,634,821 | 1/1972 | Bossen | 371/38 |
| 3,745,525 | 7/1973 | Hong | 371/37 |
| 3,755,779 | 8/1973 | Price | 371/38 |
| 4,464,753 | 8/1984 | Chen | 371/38 |
| 4,509,172 | 4/1985 | Chen | 371/38 |
| 4,617,664 | 10/1986 | Aichelmann | 371/38 |
| 4,651,321 | 3/1987 | Woffinden et al. | 371/38 |
| 4,661,955 | 4/1987 | Arlington et al. | 371/38 |
| 4,713,816 | 12/1987 | Van Gils | 371/38 |

OTHER PUBLICATIONS

IBM Technical Disclosure Bulletin Article: vol. 22, No. 6, Nov. 1979; "SEC-DED Codes with Package Error Detection Ability"; by C. L. Chen, pp. 2356-2359.
Ibid. vol. 24, No. 10, Mar. 1982, "Optimized Error Correction/Detection for Chips . . . By-1", by W. H. Cochran et al, pp. 5275-5276.
Ibid. vol. 28, No. 1, Jun. 1985, "Dual Mode Error Correction and Detection", by C. L. Chen, pp. 55-58.

Primary Examiner—Charles E. Atkinson
Attorney, Agent, or Firm—L. D. Cutter; W. J. McGinnis

[57] ABSTRACT

A reduced redundancy error correction and detection code is shown for memory organized with several bits of the data word on each chip. This package error correction and detection will correct all errors on any one chip and detect errors on more than one chip. A certain arrangement of an ECC matrix is first created for a symbol size code greater than the number of bits per chip. Thereafter certain columns of the matrix are removed to create the final code having a symbol size the same as the number of bits per chip. A specific example of an 80 bit code word is shown having 66 data bits and 14 check bits for a 4-bit-per-chip memory.

5 Claims, 7 Drawing Sheets

MATRIX FOR GENERATION OF ECC

FIG. 1A MATRIX FOR GENERATION OF ECC

H =

FIG. 1B  MATRIX FOR GENERATION OF ECC

FIG. 2A  MATRIX FOR ERROR CORRECTION/DETECTION

FIG. 2B  MATRIX FOR ERROR CORRECTION/DETECTION

MAPPING OF BIT POSITIONS TO CHIPS

| CHIP | BITS | | | |
|---|---|---|---|---|
| 1 | 1 | 2 | 3 | 4 |
| 2 | 5 | 6 | 7 | 8 |
| 3 | 9 | 10 | 11 | 12 |
| 4 | 13 | 22 | 31 | 40 |
| 5 | 21 | 23 | 32 | 41 |
| 6 | 14 | 30 | 33 | 42 |
| 7 | 15 | 24 | 34 | 43 |
| 8 | 16 | 25 | 35 | 44 |
| 9 | 17 | 26 | 36 | 45 |
| 10 | 18 | 27 | 37 | 46 |
| 11 | 19 | 28 | 38 | 47 |
| 12 | 20 | 29 | 39 | 48 |
| 13 | 56 | 57 | 65 | 73 |
| 14 | 49 | 64 | 66 | 74 |
| 15 | 50 | 58 | 67 | 75 |
| 16 | 51 | 59 | 68 | 76 |
| 17 | 52 | 60 | 69 | 77 |
| 18 | 53 | 61 | 70 | 78 |
| 19 | 54 | 62 | 71 | 79 |
| 20 | 55 | 63 | 72 | 80 |

GENERATION OF ERROR SIGNALS
i=1, 4-20

$S_1$: 4 BITS $S_2$: 10 BITS

FIG. 5 GENERATION OF ERROR SIGNALS, i=2 &3

$$H(20) = \begin{vmatrix} 1 & 0 & 1 & 0 \\ 1 & 1 & 0 & 1 \\ 0 & 1 & 0 & 0 \\ 1 & 0 & 1 & 0 \\ 0 & 1 & 0 & 1 \\ 1 & 0 & 1 & 1 \\ 0 & 1 & 0 & 1 \\ 1 & 0 & 0 & 1 \\ 1 & 1 & 0 & 0 \\ 0 & 1 & 1 & 0 \end{vmatrix}$$

ERROR CORRECTING CODE FOR 8-BIT-PER-CHIP MEMORY WITH REDUCED REDUNDANCY

RELATED APPLICATION

This is a continuation of application Ser. No. 075,390 filed July 20, 1987, now abandoned.

BACKGROUND OF THE INVENTION

This invention relates to error detection and correction and in particular to symbol error correction. A symbol is a subset of adjacent bits in a data word and the term package error detection and correction is sometimes used. In particular, this invention relates to reduced redundancy symbol error detection and correction code which has particular application to a memory organized on a b-bit per chip basis where the symbol size is b.

Applicants earlier U.S. Pat. No. 4,464,753 which is assigned to the same assignee as this application shows a general scheme for package error correction and an application to a symbol size of 2. U.S. Pat. No. 3,634,821 also shows a b-adjacent code.

Applicants earlier U.S. Pat. No. 4,509,172 assigned to the same assignee as this application shows a code for package error detection with reduced redundancy. However, this patent does not show package error correction and is different from the present invention.

A package error correction system for a 4 bit per package memory is shown in U.S. Pat. No. 4,617,664 assigned to the same assignee as this invention. This patent does not show two symbol error detection, however. In addition, the present invention represents a reduced redundancy over the system shown in the patent.

Other prior art U.S. Pat. Nos. known to Applicant are 3,755,779; 3,745,525; 3,623,155 and 3,629,824 none of which, however, anticipate the present invention.

U.S. Pat. No. 4,661,955 assigned to the same assignee as the present invention, shows a system for detecting and eliminating soft errors in a package ECC.

The IBM Technical Disclosure Bulletin also contains articles dealing with package error detection or correction. In particular, "SEC-DED Codes With Package Error Detection Ability", November 1979, pages 2356-2359; "Optimized Error Correction/Detection For Chips Organized Other Than By−1", March 1982, pages 5275-5276 and "Dual-Mode Error Correction and Error Detection", June 1985, pages 55-58 illustrate the state of the art but do not anticipate the present invention.

Because of the cost of a system, such as a memory, is dependent on the number of bits required for error detection and correction, any reduction in the resource required for the system will produce a cost savings. Therefore, it is desirable to have an improved error correction and detection system with reduced redundancy to save on costs in a system, such as a memory.

SUMMARY OF THE INVENTION

This invention is a symbol or package error correcting and detecting code having a reduced redundancy. An embodiment of the code is shown in connection with four bit-per-chip memories where an SSC-DSD (single symbol correction - double symbol detection) code is shown for 66 data bits with 14 extra bits to form an 80 bit code word. This represents a savings of 2 redundancy bits as compared to the prior art. Thus, there may be two additional data bits in an 80 bit code word.

The code according to the invention is formed by first preparing the general form H matrix for a b-bit-per-package SSC-DSD code according to the prior art where the symbol size is b, the code length is bN where there are N packages and the number of check bits is r. Then this general form H matrix is converted to a standard form H(s) matrix where the first non-zero b×b submatrix of each of the N b-column groups of the matrix is the bxb identity matrix.

The new code is constructed from H(s) by removing the same set of e columns from each b-column group of the H(s) matrix to form an intermediate matrix H(I) where e is the number of reduced bits from the general H matrix SSC−DSD code. Finally, remove the e all zero rows from the matrix H(I) just formed to create a resultant matrix H(r) with symbol size b−e and code length (b−e)N and the number of check bits equal to r−e.

THE DRAWINGS

FIGS. 1A and 1B, viewed in left to right relationship, represent an error correction and detection code matrix for producing check bits for a particular example of a code according to the invention.

FIGS. 2A and 2B, viewed in left to right order, represent a resultant matrix for error correction and detection according to the present invention.

FIG. 5 is a block diagram of the remainder of the circuit for the i symbol where i=2 and 3 shown in FIG. 4 according to the present invention.

DESCRIPTION OF THE PREFERRED EMBODIMENT

Figures 3, 4:
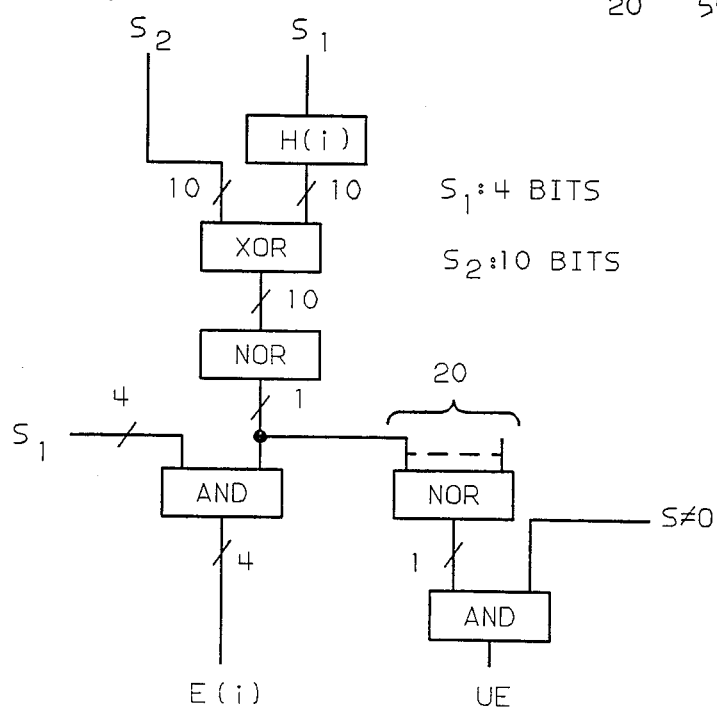
FIG. 3 shows the mapping of bit positions to memory chips for a 4-bit per chip memory using the code shown in FIGS. 2A and 2B for a particular embodiment according to the present invention.
FIG. 4 is a block diagram of part of the circuit for the i symbol where i=1 or 4-20 for generating error signals and identifying uncorrectable errors (UEs) for a code in a system according to an embodiment of the present invention as shown in FIGS. 2A and 2B and organized as shown in FIG. 3.

A computer memory designed with an error correcting code (ECC) is conventionally organized in a one-bit-per-chip fashion with respect to the ECC words. This organization guarantees that at most one bit of an ECC word would be corrupted by a chip failure. The class of SEC-DED (single error correcting and double error detecting) codes are normally used to control the errors in the one-bit-per-chip memory systems.

The trend in memory chip design has been toward denser and bigger chips. The designs of memory chips that can store 4 megabits and 16 megabits have already been reported. If 4 megabit chips are used to design a one-bit-per-chip memory system with an 8 data byte bandwidth, the minimum capacity would be 32 megabytes. However, many systems do not require 32 megabytes of storage. As a result, the system designer would be forced to store multiple bits of the same ECC word in the same chip. Another advantage of a multiple-bit-per-chip organization is that a fewer number of chips has to powered on at a time. In the future, it will be common for memory systems to be organized in a b-bit-per-chip fashion, where b is greater than one.

In a b-bit-per-chip memory organization, a chip failure would generate a symbol error, an error pattern consisting of one to b errors, in the data word. The conventional SEC-DED codes would not be able to effectively control symbol errors. Also, if b is greater than 2, a symbol error may be miscorrected by an SEC-DED code. Thus, there is a of losing data integrity.

The appropriate for a b-bit-per-chip memory design is the class of SSC-DSD codes that can correct all single symbol errors all double symbol errors in an ECC word, where a symbol error is a b-bit error pattern generated from a chip failure. An SSC-DSD code is capable of correcting all the errors generated from any single chip failures and detecting all the errors generated from two chip failures. A technique is described for the construction of SSC-DSD codes that are more efficient than previous known codes. That is, a new code requires a fewer number of check bits for the same amount of data bits, or a new code can protect more data bits with the same number of check bits as compared to a known SSC-DSD code. For an example, a known SSC-DSD code for 64 data bits and b=4 requires 16 check bits. A comparable new code according to this invention requires only 14 check bits. As another example, for b=4 and 20 check bits, the most efficient known SSC-DSD code can protect 2036 data bits, while a new code according to this invention with 19 check bits can protect 4081 data bits.

A code word of an SSC-DSD code consists of N b-bit symbols, or bN bits. Let $C=(C_1, C_2, \ldots, C_N)$ be a code word, where each component $C_i$, $1 \leq i \leq N$, of C is a symbol of b-bit pattern. The code word must satisfy a set of linear equations that can be expressed as:

$$H \cdot C^t = 0 \bmod 2, \qquad (1)$$

where $C^t$ is the transpose of C, and H, the parity check matrix of the code, is a binary matrix with bN columns. The columns of H can be divided into N b-column groups. If the rank of H is equal to r, then the code has r check bits and bN−r data bits. The code is conventionally denoted as a (bN, bN−r) code, where bN is the code length and bN−r is the number of data bits.

The symbol weight of a vector is the number of non-zero symbols in the vector. The symbol distance of two vectors is the number of symbol positions in which the two vectors are different. The minimum symbol distance of a code is the minimum of the symbol distance between any two code words of the code. A code is an SSC−DSD code if the minimum symbol distance of the code is equal to or greater than four.

The parity check matrix of a known code constructed according to the prior art has the following general form:

$$H = \begin{vmatrix} T_{11} & T_{12} \ldots T_{1N} \\ T_{12} & T_{22} \ldots T_{2N} \\ \cdot & \cdot \\ \cdot & \cdot \\ \cdot & \cdot \\ T_{R1} & T_{R2} \ldots T_{RN} \end{vmatrix} \qquad (2)$$

where each of the b×b submatrix $T_{ij}$ is either an all zeros matrix or a power of the companion matrix of a primitive polynomial of degree b. For an example, the companion matrix of the primitive polynomial $1+x+x^4$ is:

$$T = \begin{vmatrix} 0 & 0 & 0 & 1 \\ 1 & 0 & 0 & 1 \\ 0 & 1 & 0 & 0 \\ 0 & 0 & 1 & 0 \end{vmatrix}$$

All 15 distinct powers of this companion matrix are shown in Table 1.

Note that $T^0$ is the identity matrix and $T^*$ is used to denote the all zeros matrix. Note, also that the inverse of T is $T^{-1}=T^{14}$, and $T^{-i}=T^{15-i}$. Table 2(A) shows the general parity check matrix, in terms of T of Table 1, for a (44,32) SSC-DSD code with symbol size b=4. Table 2(B) shows the parity check matrix in standard form to be explained later.

A word W read from the memory at a particular location may not be the same as the code word C originally written into the same location, because errors may be generated from physical failures. The difference between W and C is defined as the error pattern E. Let $W=(W_1, W_2, \ldots, W_N)$ and $E=(E_1, E_2, \ldots, E_N)$. Then $W=C+E$, and $E_i=W_i-C_i$ for $1 \leq i \leq N$. From (1), we have $$\begin{aligned} S &= H \cdot W^t \\ &= H \cdot (C^t + E^t) \\ &= H \cdot E^t. \end{aligned} \qquad (3)$$

The vector S is called the error syndrome. The vector S is calculated from the parity check matrix H and the word W read from the memory, and it is independent of the original code word C that was stored in the memory. If there is no error in W, i.e. E=0, then S is an all zero vector. On the other hand, if S is not an all zero vector, then errors in W are detected. In this case, the error correction process is to determine first the error pattern E, then to recover the original code word C by the bit-by-bit exclusive or (XOR) operation of W and E, which is equivalent to saying C=W−E.

The parity check matrix of an SSC-DSD code with symbol size b and code length bN is said to be in a standard form if the first non-zero b×b submatrix of each of the N b-column groups of the matrix is the b×b identity matrix. If the parity check matrix H is first generated in the general form of equation (2) above, the matrix can be transformed into a standard form using the following algorithm.
1. Set j=0.
2. Let j=j+1. If j>N, exit.

3. Let k be the smallest integer i, $1 \leq i \leq R$, such that $T_{ij}$ is a non-zero matrix. Replace $T_{ij}$ by $T_{ij} \cdot (T_{kj})^{-1} \mod 2$ for $k \leq i \leq R$, where $(T)^{-1}$ denotes the inverse of matrix T.

4. Go back to step 2.

Applying the algorithm, the parity matrix of Table 2(A) can be transformed into a standard form as shown in Table 2(B). If the original parity check matrix defines an SSC-DSD code, the transformed matrix in standard form also defines an SSC-DSD code with the same number of check bits.

A new code is now constructed from a known code. Let H be the parity check matrix of a known (b'N, b'N−r) SSC-DSD code with a symbol size of b'. The number of check bits for the code is equal to r. The procedure to construct a new SSC-DSD code with a symbol size of (b'−e)=b is as follows:

1. Transform matrix H into a standard form.
2. Delete consistently the same set of e columns from each b'-column group of the matrix in standard form H(s). Then delete the e all zeros rows from the resultant matrix. Let H(r) be the final resultant matrix. Then H(r) is the parity check matrix of an SSC-DSD code with symbol size (b'−e)=b and code length (b'−e)N. The number of check bits is equal to r-e. In general, e can be 1 or greater than 1.

If the fourth column of each of the 11 column groups of the matrix in Table 2(B) is deleted, and the fourth row of the matrix is also deleted, the matrix becomes the form shown in Table 3. The new matrix defines a (33,22) SSC-DSD code with symbol size b=3.

Table 4 shows the parameters of some new and more efficient SSC-DSD codes that can be constructed from the technique described in this section.

A memory system is to be organized in 4 bits per chip, and an SSC-DSD code is to be used to protect 66 data bits. A previously known code would require 16 check bits. From Table 4, a new code of length 136 with 14 check bits can be constructed. This code can be shortened to protect 66 data bits, resulting in a (80,66) code that saves 2 check bits as compared to the best previously known code. Also for an 80 bit code word, two additional data bits may be provided. The construction of a (80,66) SSC-DSD code with b=4 is described below.

The primitive polynomial $1+x^2+x^5$, is used along with its companion matrix.

$$T = \begin{vmatrix} 0 & 0 & 0 & 0 & 1 \\ 1 & 0 & 0 & 0 & 0 \\ 0 & 1 & 0 & 0 & 1 \\ 0 & 0 & 1 & 0 & 0 \\ 0 & 0 & 0 & 1 & 0 \end{vmatrix} \quad (4)$$

Let b'=5, R=3, and N=34. The parity check matrix of the form (2) can be designed to define an SSC-DSD code with a symbol size of 5. The entries of the parity check matrix are powers of T or the 5×5 all zeros matrix. Only 20 of the 34 column groups are selected to form the following matrix.

| 0 | * | * | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|
| * | 0 | * | 2 | 4 | 1 | 5 | 6 | 17 | 7 | 16 | 8 | 0 | 3 | 30 | 29 | 18 | 28 | 19 | 27 |
| * | * | 0 | 2 | 0 | 3 | 30 | 29 | 18 | 28 | 19 | 27 | 4 | 1 | 5 | 6 | 17 | 7 | 16 | 8 |

Figure 2A:
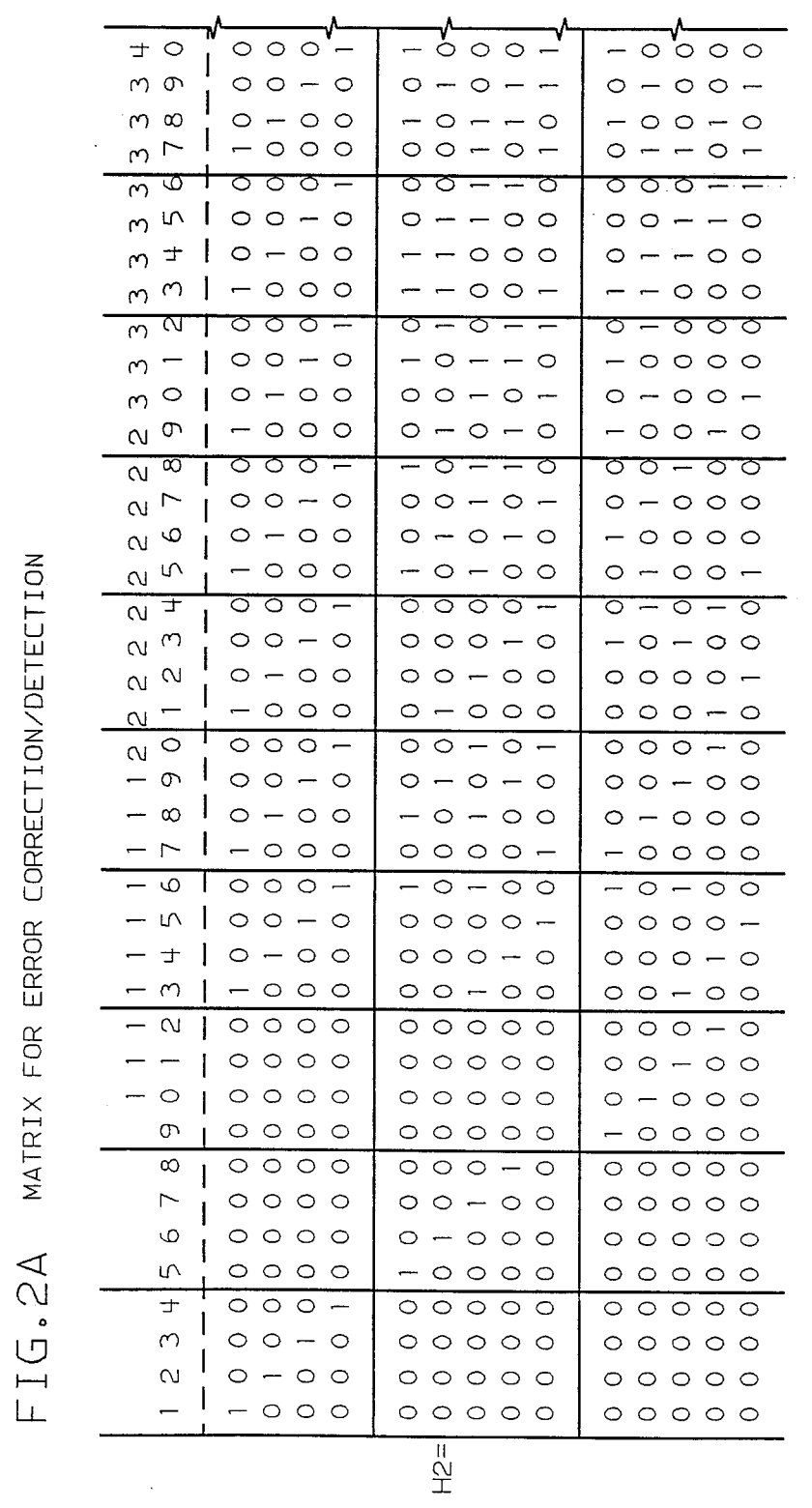
Figure 2B:
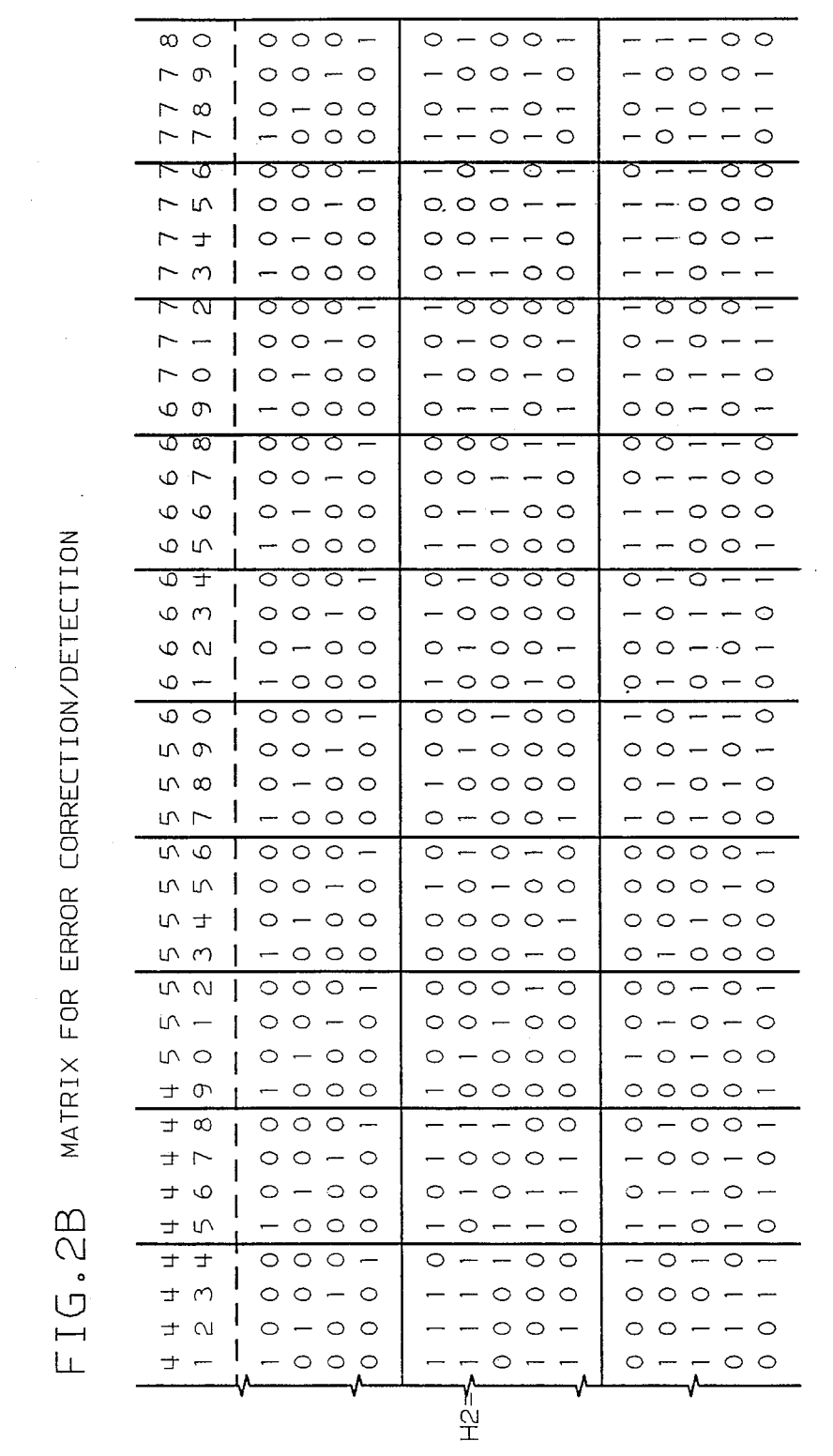

Let H be the 15×100 binary matrix obtained from the mapping of the above matrix according to the following rules: map * into a 5×5 all zeros matrix, and map i into Ti, for $0 \leq i \leq 30$, where T is the matrix of (4). Matrix H defines a (100,85) SSC-DSD code with b'=5. Now, delete the fourth row of H and delete also every other fifth column of H. The resultant matrix H2 is shown in FIG. 2. This 14×80 matrix is the parity check matrix of a (80,66) SSC-DSD code with b=4.

Figure 1A:
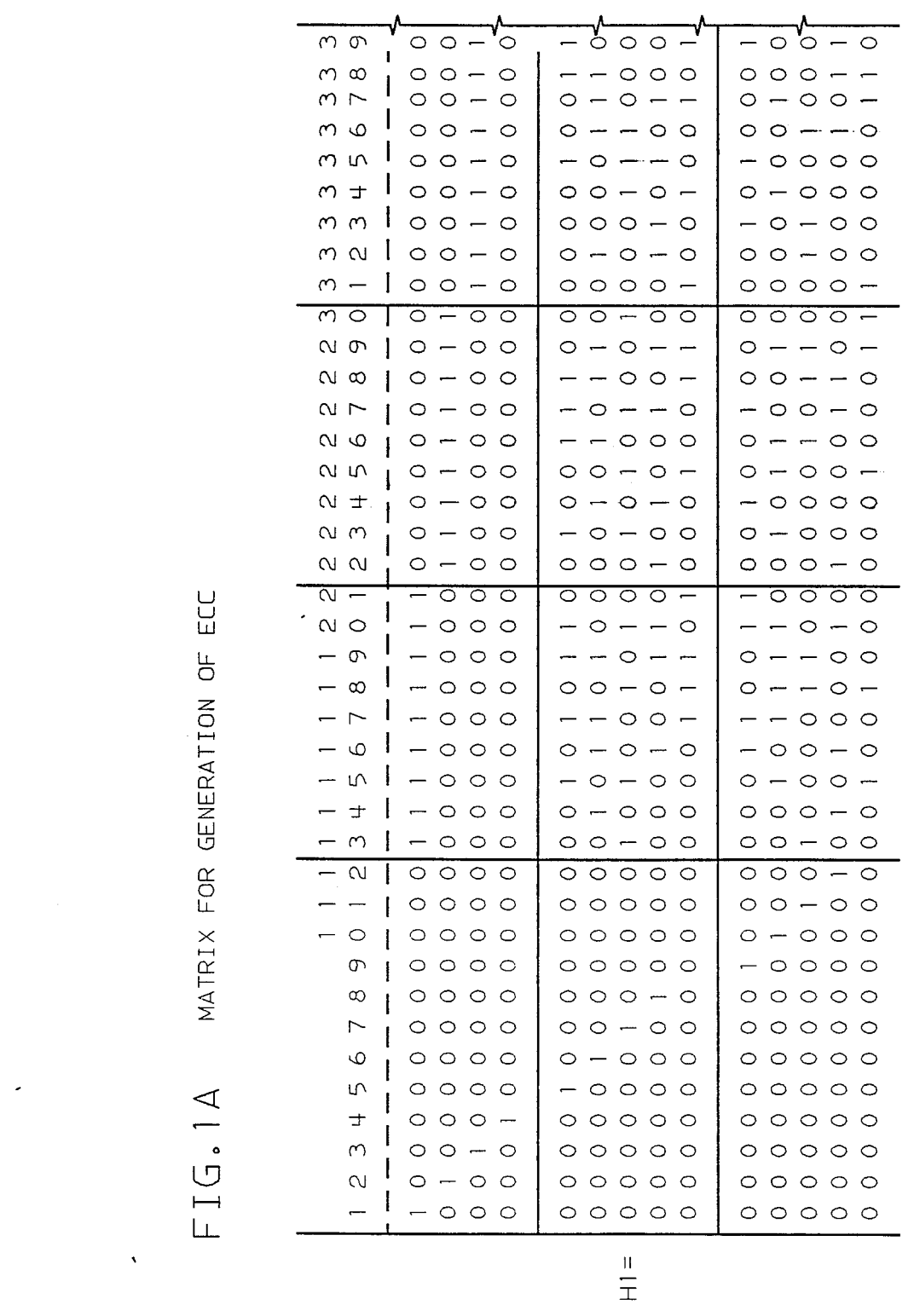
Figure 1B:
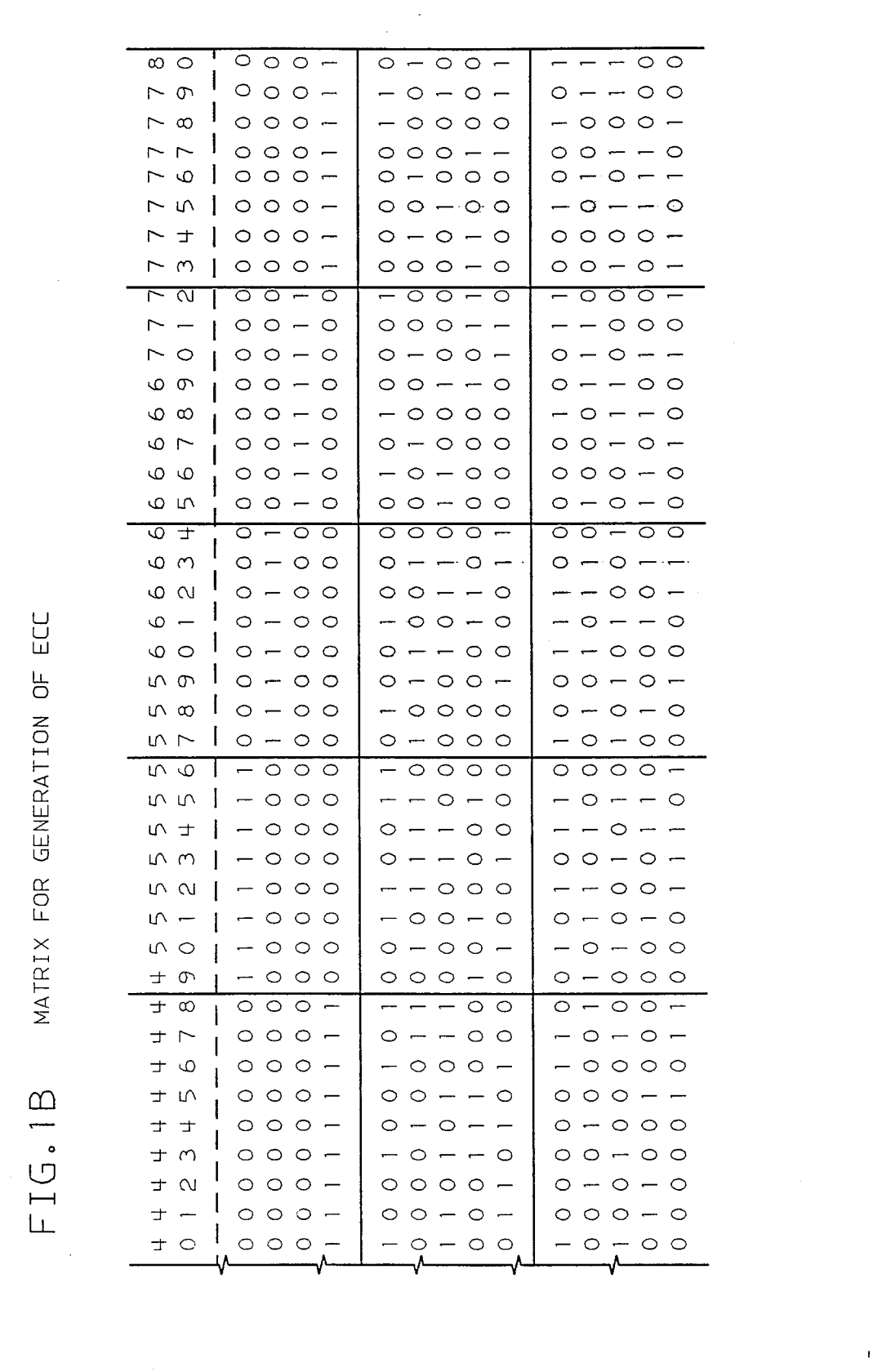

In memory system design, it may be desirable to check byte parity in a speedy way. In this case, it is also desirable to be able to include some byte parities as interim results in the generation of ECC check bits. Byte parities do not need to be generated to transfer data. For this consideration, we permute the columns of the matrix in FIG. 2 to obtain the matrix H1 in FIG. 1. Matrix H1 will be used to generate the ECC check bits.

Referring to matrix H1, any set of 14 bit-positions can be designated as the locations of check bits as long as the corresponding 14 columns of H1 form a non-singular matrix, i.e., those 14 columns are linearly independent. Designate positions 1-12, 21 and 30 as ECC check bit positions. Note that each of the first four ECC check bits can be obtained from the parities of two data bytes (the vertical lines in H1 define the data byte boundaries). For example, ECC bit 4 is the sum (XOR) of byte parity of bits 40-48 and the byte parity of bits Matrix H1 provides rules for the generation of the fourteen ECC check bits. From (1), the XOR sum of a code word at the positions indicated by the ones in each row of H1 has to be equal to 0. Thus, the rows of H1 define 14 equations that a code word has to satisfy. The ECC check bits are derived from these equations. For example, check bit 5 is the XOR sum of data bits at positions 15, 17, 19, 20, 23, 26-28, 35, 38-40, 43, 46, 48, 51, 52, 55, 56, 58, 61, 66, 68, 72, 78 and 79.

The syndrome of a code word read from the memory is the XOR of the ECC bits read directly from the memory and the ECC bits generated from the data read from the memory. It can be verified that the syndromes of errors in all single chips are nonzero and distinct and the syndromes of errors in all double chips are not the same as any one of the correctable error syndromes.

If the fourteen syndrome bits are all zeros, no error is assumed. If the syndrome is nonzero, there are errors in the code word. In this case, the chip positions and bit positions of the errors have to be identified. All double chip errors and some multiple chip errors will be detected as UE (uncorrectable errors). In the following description, the first four bits of the syndrome are called S1 and the last ten bits of the syndrome are called S2.

The matrix of FIG. 2 is used for processing the syndrome in error correction. The matrix is divided into 20 submatrices, one for each chip, of four columns. Each submatrix consists of a 4×4 identity matrix and a 10×4 matrix H(i) for i=1, 2, ..., 20. To check if a chip i is in error, H(i) is multiplied by S1, and the resultant ten bit pattern is compared with S2. If there is a total agreement, chip i is in error and S1 is the four bit error pattern within chip i. If there is a disagreement, then chip i is error-free. FIG. 3 shows the assignment of code word bit positions to chips for this embodiment. The block diagram of FIG. 4 shows the logic for the identification of errors in chip i for i=1 and 4–20. FIG. 5 shows the logic for chips 2 and 3. If the syndrome is nonzero and there is no error indicator in each of the twenty chips, then the UE signal should be on for an uncorrectable error.

Figure 6A:
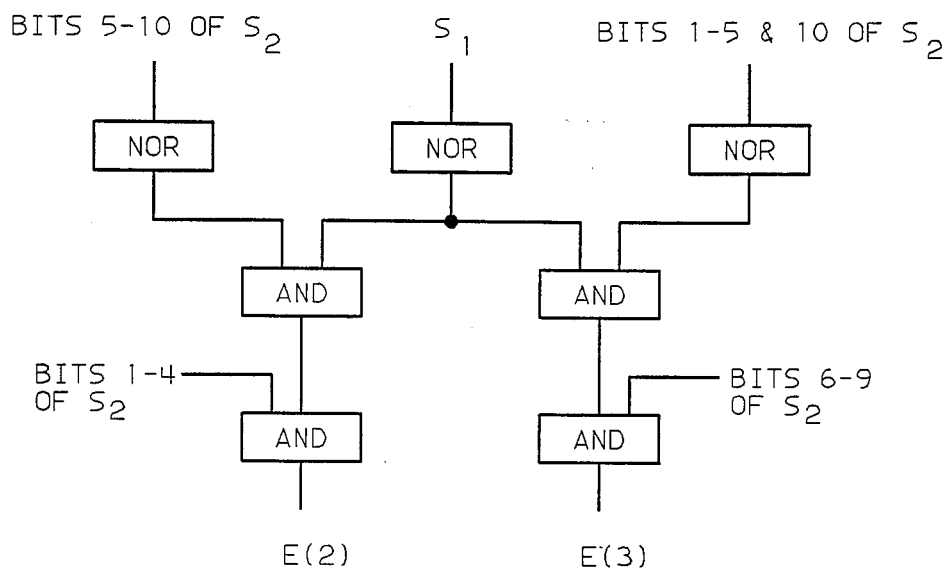
FIG. 6A is the H(i) matrix, where i=20, for multiplication with the S1 signal as shown in FIG. 4 according to the present invention.
Figure 6B:
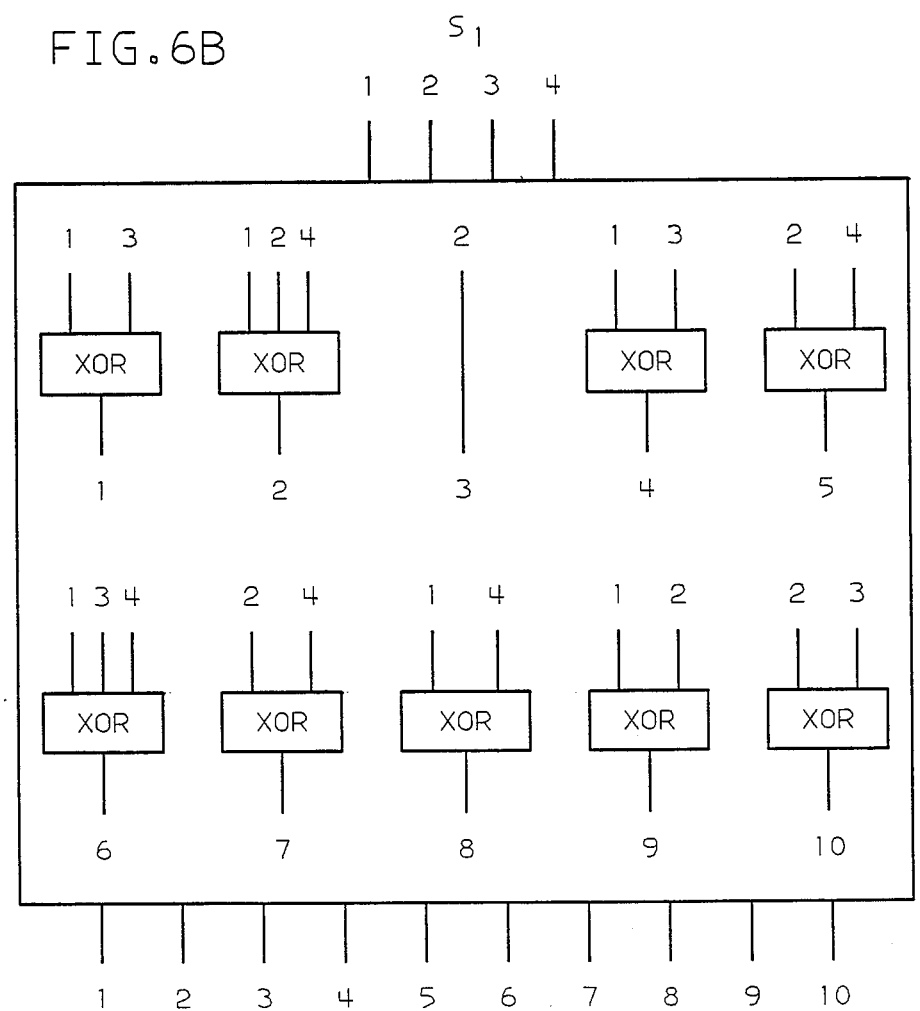
FIG. 6B is the logic required to perform the multiplication of the matrix shown in FIG. 6A by the S1 signal as shown in FIG. 4 according to the present invention.

The multiplication H(i) by S1 can be implemented with an XOR tree. FIG. 6B is an illustration of the multiplication for i=20. H(i=20) is shown in FIG. 6A. The 1–10 individual output bits are shown at the bottom of the XOR blocks while the 1–4 input bits are shown at the top.

TABLE 1
Powers Of The Companion Matrix Of $1 + x + x^4$ $$T^* = 0 = \begin{vmatrix} 0 & 0 & 0 & 0 \\ 0 & 0 & 0 & 0 \\ 0 & 0 & 0 & 0 \\ 0 & 0 & 0 & 0 \end{vmatrix} \quad I = \begin{vmatrix} 1 & 0 & 0 & 0 \\ 0 & 1 & 0 & 0 \\ 0 & 0 & 1 & 0 \\ 0 & 0 & 0 & 1 \end{vmatrix} = T^0$$

$$T^1 = \begin{vmatrix} 0 & 0 & 0 & 1 \\ 1 & 0 & 0 & 1 \\ 0 & 1 & 0 & 0 \\ 0 & 0 & 1 & 0 \end{vmatrix} \quad T^2 = \begin{vmatrix} 0 & 0 & 1 & 0 \\ 0 & 0 & 1 & 1 \\ 1 & 0 & 0 & 1 \\ 0 & 1 & 0 & 0 \end{vmatrix}$$

$$T^3 = \begin{vmatrix} 0 & 1 & 0 & 0 \\ 0 & 1 & 1 & 0 \\ 0 & 0 & 1 & 1 \\ 1 & 0 & 0 & 1 \end{vmatrix} \quad T^4 = \begin{vmatrix} 1 & 0 & 0 & 1 \\ 1 & 1 & 0 & 1 \\ 0 & 1 & 1 & 0 \\ 0 & 0 & 1 & 1 \end{vmatrix}$$

$$T^5 = \begin{vmatrix} 0 & 0 & 1 & 1 \\ 1 & 0 & 1 & 0 \\ 1 & 1 & 0 & 1 \\ 0 & 1 & 1 & 0 \end{vmatrix} \quad T^6 = \begin{vmatrix} 0 & 1 & 1 & 0 \\ 0 & 1 & 0 & 1 \\ 1 & 0 & 1 & 0 \\ 1 & 1 & 0 & 1 \end{vmatrix}$$

$$T^7 = \begin{vmatrix} 1 & 1 & 0 & 1 \\ 1 & 0 & 1 & 1 \\ 0 & 1 & 0 & 1 \\ 1 & 0 & 1 & 0 \end{vmatrix} \quad T^8 = \begin{vmatrix} 1 & 0 & 1 & 0 \\ 0 & 1 & 1 & 1 \\ 1 & 0 & 1 & 1 \\ 0 & 1 & 0 & 1 \end{vmatrix}$$

$$T^9 = \begin{vmatrix} 0 & 1 & 0 & 1 \\ 1 & 1 & 1 & 1 \\ 0 & 1 & 1 & 1 \\ 1 & 0 & 1 & 1 \end{vmatrix} \quad T^{10} = \begin{vmatrix} 1 & 0 & 1 & 1 \\ 1 & 1 & 1 & 0 \\ 1 & 1 & 1 & 1 \\ 0 & 1 & 1 & 1 \end{vmatrix}$$

$$T^{11} = \begin{vmatrix} 0 & 1 & 1 & 1 \\ 1 & 1 & 0 & 0 \\ 1 & 1 & 1 & 0 \\ 1 & 1 & 1 & 1 \end{vmatrix} \quad T^{12} = \begin{vmatrix} 1 & 1 & 1 & 1 \\ 1 & 0 & 0 & 0 \\ 1 & 1 & 0 & 0 \\ 1 & 1 & 1 & 0 \end{vmatrix}$$

$$T^{13} = \begin{vmatrix} 1 & 1 & 1 & 0 \\ 0 & 0 & 0 & 1 \\ 1 & 0 & 0 & 0 \\ 1 & 1 & 0 & 0 \end{vmatrix} \quad T^{14} = \begin{vmatrix} 1 & 1 & 0 & 0 \\ 0 & 0 & 1 & 0 \\ 0 & 0 & 0 & 1 \\ 1 & 0 & 0 & 0 \end{vmatrix}$$

TABLE 2
Parity Check Matrix Of A (44,32) SSC-DSD Code With b = 4

(A) General Form $$H = \begin{matrix} I & O & O & I & T^1 & T^2 & T^3 & T^4 & T^5 & T^6 & T^7 \\ O & I & O & I & T^2 & T^4 & T^6 & T^8 & T^{10} & T^{12} & T^{14} \\ O & O & I & I & T^3 & T^6 & T^9 & T^{12} & I & T^3 & T^6 \end{matrix}$$

(B) Standard Form $$H = \begin{matrix} I & O & O & I & I & I & I & I & I & I & I \\ O & I & O & I & T^1 & T^2 & T^3 & T^4 & T^5 & T^6 & T^7 \\ O & O & I & I & T^2 & T^4 & T^6 & T^8 & T^{10} & T^{12} & T^{14} \end{matrix}$$

TABLE 3
Parity Check Matrix Of A (33,21) SSC-DSD Code With b = 3

| 100 | 000 | 000 | 100 | 100 | 100 | 100 | 100 | 100 | 100 | 100 |
|---|---|---|---|---|---|---|---|---|---|---|
| 010 | 000 | 000 | 010 | 010 | 010 | 010 | 010 | 010 | 010 | 010 |
| 001 | 000 | 000 | 001 | 001 | 001 | 001 | 001 | 001 | 001 | 001 |
| 000 | 100 | 000 | 100 | 000 | 001 | 010 | 100 | 001 | 011 | 110 |
| 000 | 010 | 000 | 010 | 100 | 000 | 011 | 110 | 101 | 010 | 101 |
| 000 | 001 | 000 | 001 | 010 | 100 | 001 | 011 | 110 | 101 | 010 |
| 000 | 000 | 000 | 000 | 001 | 010 | 100 | 001 | 011 | 110 | 101 |
| 000 | 000 | 100 | 100 | 001 | 100 | 011 | 101 | 101 | 111 | 110 |
| 000 | 000 | 010 | 010 | 001 | 110 | 010 | 011 | 111 | 100 | 001 |
| 000 | 000 | 001 | 001 | 100 | 011 | 101 | 101 | 111 | 110 | 000 |
| 000 | 000 | 000 | 000 | 010 | 001 | 110 | 010 | 011 | 111 | 100 |

TABLE 4
Parameters of Some New SSC-DSD Codes

| No. of Check Bits | Symbol Size b | Code Length of Best Known Codes | Code Length of New Codes |
|---|---|---|---|
| 14 | 4 | 18 × 4 | 34 × 4 |
| 15 | 3 | 133 × 3 | 257 × 3 |
| 18 | 3 | 650 × 3 | 1025 × 3 |
| 19 | 4 | 257 × 4 | 1025 × 4 |

While the invention has been described with reference to the preferred embodiments thereof, various modifications and changes may be made to those skilled in the art without departing from the true spirit and scope of the invention as defined by the claims hereof.

Having thus described my invention, what I claim as new and desire to secure by Letters Patent is:

1. A method of producing a reduced redundancy ECC code for a b-bit-per-package system comprising:
   (a) determine the general form H parity check matrix of a corresponding single symbol correction-double symbol detection code with symbol size $b' > b$ and code length b'N where there are N packages and the number of check bits is r;
   (b) convert the general form H matrix of step (a) into the standard form matrix H(s) where the first nonzero $b' \times b'$ submatrix of each of the N b'-column groups of the matrix is the $b' \times b'$ identity matrix;
   (c) construct the new code from H(s) by:
      (i) first delete consistently the same set of e columns from each b'-column group of the H(s) matrix where e is the number of reduced bits from the general H matrix SSC-DSD code,
      (ii) then delete the e all zeroes rows from the matrix formed in step (c)(i) to create a resultant matrix H(r) with symbol size $(b' - e) = b$ and code length $(b' - e)N$ and the number of check bits equal to $r - e$.

2. The method of claim 1 wherein b=4, N=20, code length equals 80 and number of check bits equals 14 and the matrix H1 for generation of the code is:

$$H1 = \begin{bmatrix}
& & & & & & & & & 1 & 1 & 1 & 1 & 1 & 1 & 1 & 1 & 1 & 1 & 2 & 2 & 2 & 2 & 2 & 2 & 2 & 2 & 2 & 3 & 3 & 3 & 3 & 3 & 3 & 3 & 3 & 3 \\
1&2&3&4&5&6&7&8&9&0&1&2&3&4&5&6&7&8&9&0&1&2&3&4&5&6&7&8&9&0&1&2&3&4&5&6&7&8&9
\end{bmatrix}$$

```
              111|111111112|2|222222223|333333333
  123456789012|345678901|2345678|90|123456789
  100000000000|111111111|00000000|0|0|00000000 0
  010000000000|000000000|11111111|1|0|00000000 0
  001000000000|000000000|00000000|0|1|11111111 1
H1=000100000000|000000000|00000000|0|0|00000000 0

000010000000|001010110|01001110|0|0|00010011
  000001000000|010110100|00101011|0|0|10000111 0
  000000100000|101001010|01010100|1|0|00001110 0
  000000010000|000100110|10100101|0|0|11010100
  000000000000|000011101|00010011|0|1|00100101

000000001000|000110011|00100100|0|0|01010001
  000000000100|001011110|01011001|0|0|00100100
  000000000010|100001100|00001011|0|0|11001000
  000000000001|010100010|10000110|0|0|00001011
  000000000000|001001000|00010001|1|1|00000110
```

```
   444444444|455555555|555666666|66667777|77777778
   012345678|90123456|78901234|56789012|34567890
   000000000|11111111|00000000|00000000|00000000
   000000000|00000000|11111111|00000000|00000000
   000000000|00000000|00000000|11111111|00000000
   111111111|00000000|00000000|00000000|11111111

100100101|00110011|01001000|01010001|00000110
   000010011|01011110|10110010|00100100|01010001
   110101011|00001100|00010110|11001000|00100010
   000111000|10100010|00001100|00001011|11001000
   011010100|01001000|00100011|00000110|00001011

100000110|01010110|10011100|00010011|00100101
   001010001|10110100|01010110|10001110|00010011
   100100010|01001010|10101001|00111000|10101011
   011001000|00100110|01001010|11010100|00111000
   000001011|00011101|00100110|00100101|11010100
``` and the matrix for error correction and detection is:

```
                  111|1111|1112|2222|2222|2333|3333|3334
      1234|5678|9012|3456|7890|1234|5678|9012|3456|7890
      1000|0000|0000|1000|1000|1000|1000|1000|1000|1000
      0100|0000|0000|0100|0100|0100|0100|0100|0100|0100
      0010|0000|0000|0010|0010|0010|0010|0010|0010|0010
H2 = 0001|0000|0000|0001|0001|0001|0001|0001|0001|0001

0000|1000|0000|0001|0100|0000|1001|0010|1100|0101
      0000|0100|0000|0000|0010|1000|0100|1001|1110|0010
      0000|0010|0000|1001|0101|0100|1011|0110|0011|1100
      0000|0001|0000|0100|0010|0010|0101|1011|0001|0110
      0000|0000|0000|0010|1001|0001|0010|0101|1000|1011

0000|0000|1000|0001|1000|0010|0100|1010|1000|0101
      0000|0000|0100|0000|0100|0001|1010|0101|1100|1010
      0000|0000|0010|1001|0010|0010|0001|0000|0110|1000
      0000|0000|0001|0100|0001|1001|0000|1000|0011|0100
      0000|0000|0000|0010|0000|0100|1000|0100|0001|1010

4444|4444|4555|5555|5556|6666|6666|6777|7777|7778
      1234|5678|9012|3456|7890|1234|5678|9012|3456|7890
      1000|1000|1000|1000|1000|1000|1000|1000|1000|1000
      0100|0100|0100|0100|0100|0100|0100|0100|0100|0100
      0010|0010|0010|0010|0010|0010|0010|0010|0010|0010
H2 = 0001|0001|0001|0001|0001|0001|0001|0001|0001|0001

1110|1011|1000|0010|0100|1010|1000|0101|0001|1010
      1111|0101|0100|0001|1010|0101|1100|1010|1000|1101
      0001|1001|0010|0010|0001|0000|0110|1000|1101|0100
      1000|1100|0001|1001|0000|1000|0011|0100|0110|1010
      1100|0110|0000|0100|1000|0100|0001|1010|0011|0101
```

-continued $$\begin{Bmatrix} 0001 & 1010 & 0100 & 0000 & 1001 & 0010 & 1100 & 0101 & 1110 & 1011 \\ 1000 & 1101 & 0010 & 1000 & 0100 & 1001 & 1110 & 0010 & 1111 & 0101 \\ 1101 & 0100 & 0101 & 0100 & 1011 & 0110 & 0011 & 1100 & 0001 & 1001 \\ 0110 & 1010 & 0010 & 0010 & 0101 & 1011 & 0001 & 0110 & 1000 & 1100 \\ 0011 & 0101 & 1001 & 0001 & 0010 & 0101 & 1000 & 1011 & 1100 & 0110 \end{Bmatrix}$$

3. The method of claim 1 wherein e is equal to one.

4. A method of creating a package error correction and detection code for a 4-bit per chip memory having N chips comprising:
   first, creating a known error correcting code matrix having a 5-bit symbol length for N packages and a code word length of 5N,
   second, rearranging the code matrix created in the first step so that the first nonzero 5×5 submatrix of each of the N 5-column groups of the matrix is the 5×5 identity matrix,
   third, deleting the same 1-column groups from each 5-column group of the matrix formed in the second step, and
   finally, deleting one all zero row from the matrix formed in the third step to create a resultant matrix with symbol size 4 and code length 4N.

5. A method for encoding binary data occurring in N packages of b bits each, said method comprising the step of:

encoding said Nb bits of data using a parity check matrix H(r) said matrix H(r) being derivable from a general form parity check matrix H for a single symbol correction-double symbol detection code with symbol size b′>b and code length Nb′ and wherein there are r check bits, said matrix H(r) being formable from H by first converting the matrix H into a standard form matrix H(s) where the first non-zero b′×b′ submatrix of each of the N B′-column groups of the matrix H(s) is the b′×b′ identity matrix; and then, by converting the matrix H(s) to the matrix H(r) by consistently deleting the same set of e columns from each b′-column group of the H(s) matrix, where e is the number of reduced bits from the general H matrix SSC-DSD code; and then, by deleting the e all zero rows from the matrix formed by column deletion, so as to create the matrix H(r) with symbol size (b′−e)=b and code length (b′−e)N and with (r−e) check bits.

* * * * *